United States Patent
Chung et al.

(10) Patent No.: US 7,592,635 B2
(45) Date of Patent: Sep. 22, 2009

(54) ORGANIC ELECTROLUMINESCENT DEVICE

(75) Inventors: Jin-Koo Chung, Seoul (KR); Beom-Rak Choi, Seoul (KR); Joon-Hoo Choi, Seoul (KR); Sang-Gab Kim, Seoul (KR); Hee-Hwan Choe, Incheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 7 days.

(21) Appl. No.: 10/517,936

(22) PCT Filed: Dec. 24, 2002

(86) PCT No.: PCT/KR02/02418

§ 371 (c)(1), (2), (4) Date: Dec. 13, 2004

(87) PCT Pub. No.: WO03/107394

PCT Pub. Date: Dec. 24, 2003

(65) Prior Publication Data
US 2005/0242714 A1   Nov. 3, 2005

(30) Foreign Application Priority Data
Jun. 14, 2002   (KR) ............... 10-2002-0033326

(51) Int. Cl.
*H01L 29/227* (2006.01)
*H01L 29/04* (2006.01)
(52) U.S. Cl. .......................... 257/98; 257/59
(58) Field of Classification Search ............. 313/504, 313/505; 257/88, 89, 98, 99, E33.061, 59
See application file for complete search history.

(56) References Cited

U.S. PATENT DOCUMENTS

| | | | | |
|---|---|---|---|---|
| 6,372,661 B1 * | 4/2002 | Lin et al. | ............. | 438/769 |
| 6,933,533 B2 * | 8/2005 | Yamazaki et al. | ............. | 257/88 |
| 2001/0049030 A1 | 12/2001 | Okada et al. | | |
| 2002/0036462 A1 * | 3/2002 | Hirano | ............. | 313/506 |
| 2002/0043932 A1 * | 4/2002 | Kawashima | ............. | 313/512 |
| 2005/0038276 A1 * | 2/2005 | Laxman et al. | ............. | 556/436 |

FOREIGN PATENT DOCUMENTS

| | | |
|---|---|---|
| CN | 1353464 | 6/2002 |
| EP | 0 888 035 A1 | 12/1998 |
| JP | 2000-353594 A | 12/2000 |
| JP | 2001-126867 A | 5/2001 |
| JP | 2001-196367 | 7/2001 |
| JP | 2002-079509 A | 3/2002 |
| JP | 2002-083689 A | 3/2002 |
| JP | 2002-084723 A | 3/2002 |
| JP | 2002-164181 A | 6/2002 |

* cited by examiner

*Primary Examiner*—Hung Vu
(74) *Attorney, Agent, or Firm*—Haynes and Boone, LLP

(57) ABSTRACT

Disclosed is an organic electroluminescent (EL) device for enhancing the luminous efficiency. A first electrode is formed on a substrate. A CVD insulating film of low dielectric constant having an opening exposing the first electrode is formed on the first electrode and the substrate. An organic EL layer and a second electrode are sequentially stacked on the opening. A wall surrounding a region of the organic EL layer is formed of the CVD insulating film of low dielectric constant, the surface treatment of the pixel electrode can be performed using O2 plasma enhance luminance properties.

8 Claims, 10 Drawing Sheets

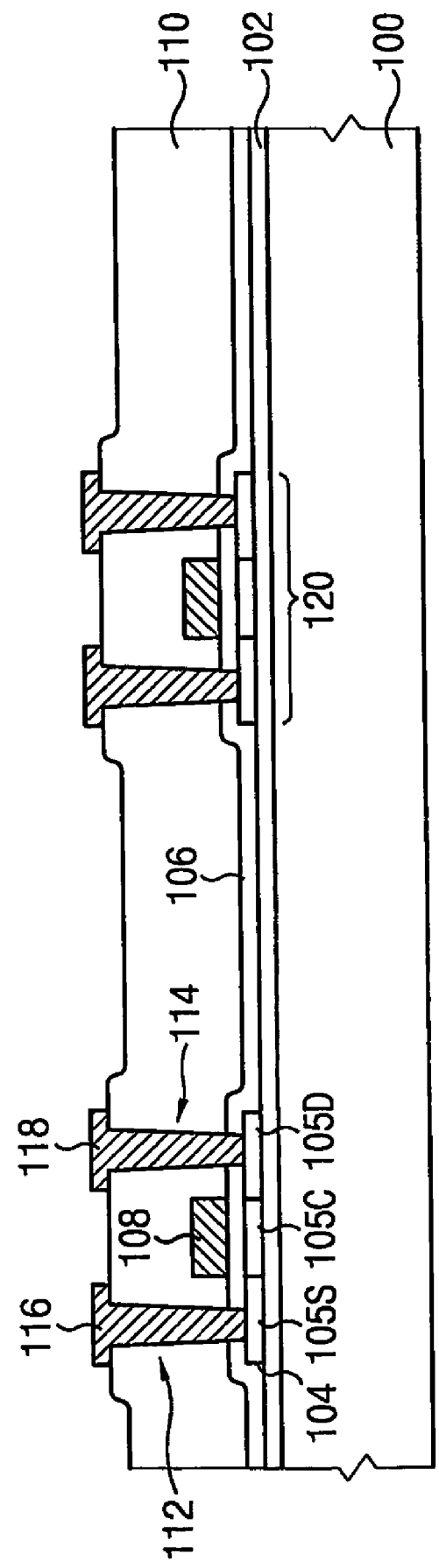

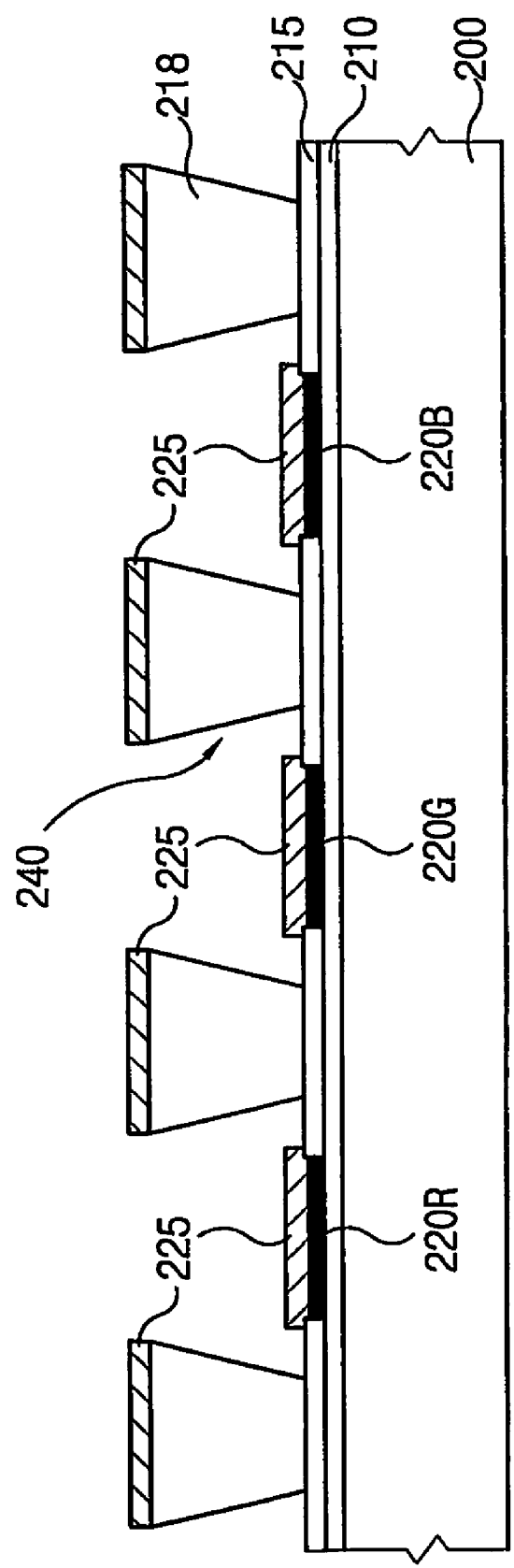

ORGANIC ELECTROLUMINESCENT DEVICE

CROSS-REFERENCE TO RELATED APPLICATION

This application is a national phase application of PCT/KR02/02418 filed on Dec. 24, 2002, and claims priority thereto under 35 USC 371. PCT/KR02/02418, in turn, claims priority from Korean Application No. 10-2002-0033326 filed on Jun. 14, 2002, the content of which is incorporated by reference herein in its entirety.

Technical Field

The present invention relates to an organic electroluminescent (EL) device, and more particularly, to an organic EL device in which a CVD insulating film of low dielectric constant is used to enhance the luminous efficiency.

Background Art

In the information society of these days, electronic display devices are more important as information transmission media and various electronic display devices are widely applied for industrial apparatus or home appliances. Such electronic display devices are being continuously improved to have new appropriate functions for various demands of the information society.

In general, electronic display devices display and transmit various pieces of information to users who utilize such information. That is, the electronic display devices convert electric information signals outputted from electronic apparatus into light information signals recognized by users through their eyes.

In the electronic display devices dividing into an emissive display device and a non-emissive display device, the emissive display device displays light information signals through a light emission phenomena thereof and the non-emissive display device displays the light information signals through a reflection, a scattering or an interference thereof. The emissive display device includes a cathode ray tube (CRT), a plasma display panel (PDP), a light emitting diode (LED) and an electroluminescent display (ELD). The emissive display device is called as an active display device. Also, the non-emissive display device, called as a passive display device, includes a liquid crystal display (LCD), an electrochemical display (ECD) and an electrophoretic image display (EPID).

The CRT has been used for a television receiver or a monitor of a computer as the display device for a long time since it has a high quality and a low manufacturing cost. The CRT, however, has some disadvantages such as a heavy weight, a large volume and high power consumption.

Recently, the demand for a new electronic display device is greatly increased such as a flat panel display device having excellent characteristics that thin thickness, light weight, low driving voltage and low power consumption. Such flat panel display devices may be manufactured according to the rapidly improved semiconductor technology.

An electroluminescent (EL) device is attracting attention of interested person as one of the flat panel displays. The EL device is generally divided into an inorganic EL device and an organic EL device depending on used materials.

The inorganic EL device is a display in which a high electric field is applied to a light emitting part and electrons are accelerated in the applied high electric field to be collided with a light emitting center, thereby exciting the light emitting center to emit light.

The organic EL device is a display in which electrons and holes are injected into a light emitting part from cathode and anode, respectively, and the injected electrons and holes are combined with each other to generate excitons, thereby emitting light when these excitons are transited from an excited state to a base state.

Owing to the above operation mechanism, the inorganic EL device needs a high driving voltage of 100-200 V, whereas the organic EL device operates at a low voltage of 5-20 V The above advantage of the organic EL device is activating researches on the organic ELD. Also, the organic EL device has superior properties such as wide viewing angle, high response speed, high contrast and the like.

The organic EL device includes a plurality of organic EL elements (i.e., pixels) suitable for display purposes such as monochrome or multi-color display, still image display, segmented display, passive or active type matrix display, etc.

The active matrix organic EL device is a display that independently drives EL elements corresponding to a plurality of pixels using switching elements such as a thin film transistor. The organic EL device is also referred to as an organic electroluminescent display (OELD) or an organic light emitting device (OLED).

In an active matrix type organic EL device, thin film transistors are formed on a transparent insulating substrate, each of the thin film transistors having an active pattern, a gate electrode and source/drain electrodes. With via holes exposing any one electrode of the source/drain electrodes, e.g., the drain electrode, a passivation layer is formed on the entire surface of the substrate including the thin film transistors.

Upon the passivation layer, there are formed pixel electrodes connected to the drain electrodes of the thin film transistors through the via holes. The pixel electrodes consisting of a transparent conductive material such as indium-tin-oxide (ITO) or indium-zinc-oxide (IZO) are provided as an anode injecting holes.

On the passivation layer including the pixel electrodes, there is formed an insulating layer having openings exposing a portion of the pixel electrodes. Organic EL layers are formed on the openings. A metal electrode for a cathode is formed on the organic EL layers.

The insulating layer serves as a wall or a bank layer surrounding a region where the organic EL layer is formed. The wall plays a role of preventing the EL layers and the layers of the non-pixel region from being in contact with a shadow mask, when the shadow mask is shifted to successively form red (R), green (G) and blue (B) EL layers. Further, the wall is provided to reduce a coupling capacitance between the pixel and cathode electrodes.

According to a conventional organic EL device, the wall is formed of a high polymeric organic insulating film, e.g., imide or acryl based organic insulating film. However, When the metal electrode is formed above the organic insulating film, the lifting of the metal electrode may be caused due to a poor adhesion of the organic insulating film.

The surface treatment process of the pixel electrode for enhancing the luminance efficiency, e.g., $O_2$ plasma treatment, cannot be utilized. This is because the high polymers of the organic insulating film are easily damaged due to the plasma. That is, when the surface treatment of the plasma electrode is performed using $O_2$ plasma, the surface of the wall is damaged so that the organic insulating film is coated on the contact region to increase a contact resistance and deteriorate the device performance. Accordingly, in case that the wall is formed of the organic insulating film, the surface treatment process of the pixel electrode cannot be used to thereby deteriorate luminance properties of the organic EL element.

Since the organic EL element may be deteriorated due to minute moisture content of the high polymers when driving the element, an additional heat treatment process may be demanded.

DISCLOSURE OF THE INVENTION

Accordingly, it is an object of the present invention to provide an organic EL device in which luminance properties can be enhanced.

In order to accomplish the above object, the present invention provides an organic EL device comprising a substrate; a first electrode formed on the substrate; a CVD insulating film of low dielectric constant formed on the first electrode and the substrate in order to suppress the formation of a coupling capacitance, the CVD insulating film having an opening exposing the first electrode; an organic EL layer formed on the opening; and a second electrode formed on the organic EL layer.

Preferably, the CVD insulating film of low dielectric constant is comprised of SiOC and has a dielectric constant of 3.5 and less. The CVD insulating film of low dielectric constant is formed to a thickness of 1 um or more.

Further, in an organic EL device of the present invention, thin film transistors are formed on a substrate, each of the thin film transistors having an active pattern, a gate insulating film, a gate electrode and source/drain electrodes. A passivation layer is formed on the thin film transistors and the substrate. Pixel electrodes are formed on the passivation layer so as to be connected to the thin film transistors. A CVD insulating film of low dielectric constant having openings exposing each of the pixel electrodes is formed on the pixel electrodes and the passivation layer. Organic EL layers are formed on each of the openings. A metal electrode is formed on the organic EL layers and the CVD insulating film of low dielectric constant.

In addition, the present invention provides an organic EL device comprising a substrate; first electrodes in a form of stripe formed on the substrate; a CVD insulating layer having openings formed on the first electrodes and the substrate, the opening being formed to have a tapered slope; organic EL layers formed on each of the openings; and second electrodes in a form of stripe formed on the organic EL layers, the first and second electrodes being arranged to cross each other.

According to the present invention, a wall surrounding a region where the organic EL layer is formed is comprised of a CVD insulating film of low dielectric constant. Since the surface of the CVD insulating film of low dielectric constant is not damaged due to plasma, the surface treatment of the pixel electrode is performed using O2 plasma to thereby enhance the luminous efficiency and the luminance properties.

BRIEF DESCRIPTION OF THE DRAWINGS

The above objects and other advantages of the present invention will become more apparent by describing in detail exemplary embodiments thereof with reference to the attached drawings in which:

FIGS. 2A to 2F are cross-sectional views illustrating a method of manufacturing the AMOLED shown in FIG. 1;

FIG. 3 is a cross-sectional view of a passive matrix type organic EL device in accordance with a second embodiment of the present invention;

BEST MODE FOR CARRYING OUT THE INVENTION

Now, exemplary embodiments of the present invention will be described in detail with reference to the attached drawings.

Figure 1:
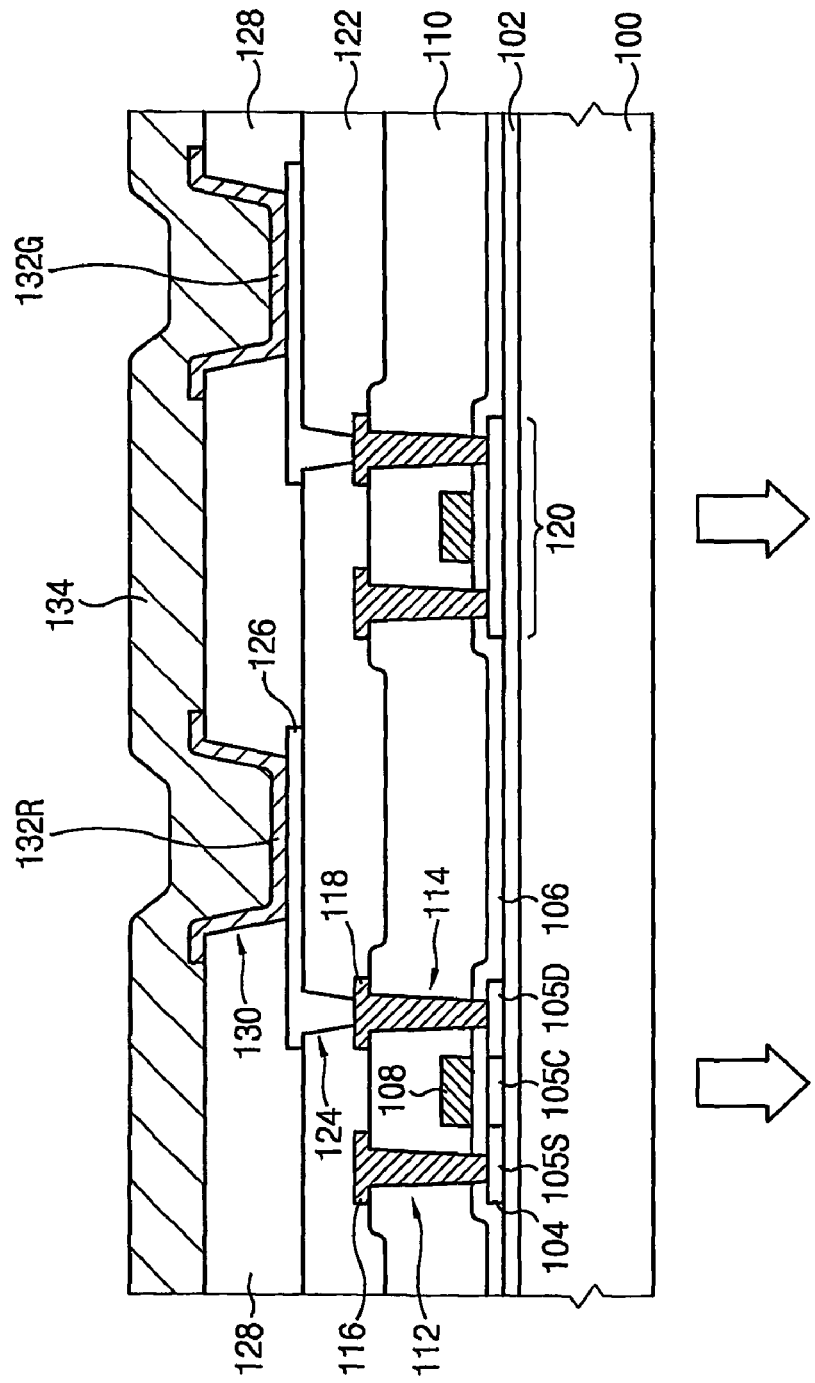
FIG. 1 is a cross-sectional view of an active matrix type organic EL device in accordance with a first embodiment of the present invention.

FIG. 1 is a cross-sectional view of an active matrix type organic EL device in accordance with a first embodiment of the present invention.

Referring to FIG. 1, a blocking layer 102 comprised of silicon oxide is formed on the entire surface of a transparent insulating substrate 100 such as glass, quartz, or sapphire. The blocking layer 102 may be skipped, but it is preferred to form the blocking layer 102 in order to prevent impurities in the substrate 100 penetrating into a silicon film during a subsequent crystallization process for an amorphous silicon film.

On the blocking layer 102, there are formed thin film transistors 120. The thin film transistor 120 includes an active pattern 104, a gate electrode 108 and source/drain electrode 116 and 118. Specifically, polycrystalline active patterns 104 are formed on the blocking layer 102. A gate insulating film 106 comprised of silicon nitride or silicon oxide is formed on the active patterns 104 and the blocking layer 102. Gate electrodes 108 are formed on the gate insulating film 106, the gate electrode 108 being across each of the active patterns 104 to define source/drain regions 105S and 105ad and a channel region 105C. That is, an intersection where the active pattern 104 is overlapped with the gate electrode 108 becomes a channel region 105C. The active pattern 104 is divided into two portions by the channel region 105C. One portion of the active pattern 104 becomes the source region 105S, and the other portion thereof is the drain region 105D. At this time, the location of the source region 105S and the drain region 105D may be changed.

An interlayer insulating film 110 comprised of an inorganic insulating material such as silicon oxide ($SiO_2$) or silicon nitride ($Si_3N_4$) is formed on the gate electrodes 108 and the gate insulating film 106.

Upon the interlayer insulating film 110, there are formed source/drain electrodes 116 and 118 connected to the source/drain regions 105S and 105D of the active pattern 104 through contact holes 112 and 114, respectively.

A passivation layer 122 comprised of an inorganic insulating material such as silicon nitride or an acryl based photosensitive organic insulating material is formed on the source/drain electrodes 116 and 118 and the interlayer insulating film 110.

Upon the passivation layer 122, there are formed pixel electrodes 126 connected with any one electrode of the source/drain electrodes 116 and 118, for example, the drain electrode 118, through via holes 124. The pixel electrode 126 comprised of a transparent conductive material such as ITO or IZO is provided as an anode of an organic EL element.

On the passivation layer 122 including the pixel electrodes 126, a CVD insulating film 128 of low dielectric constant is formed having openings 130 exposing a portion of the pixel electrodes 126. Red, green and blue organic EL layers 132R and 132G are formed on each of the opening 130. As a cathode of the organic EL element, a metal electrode 134 is formed on the organic EL layers 132R and 132G.

The organic EL layer consists of at least one organic film. That is, the organic EL layer is formed by sequentially stacking a hole injection layer (HIL), a hole transfer layer (HTL), an emission layer (EML), an electron transfer layer (ETL) and an electron injection layer (EIL). Here, the EML includes red, green and blue emission layers.

In the active matrix type organic EL device, each of the pixels are driven by signals applied to the gate electrode and the source/drain electrodes of the switching thin film transistor, so that the metal electrode 134 is formed to a common electrode.

The CVD insulating film 128 of low dielectric constant serves as a wall surrounding a region where the organic EL layer is formed. Further, the CVD insulating film 128 of low dielectric constant plays a role of preventing the EL layers and the layers of the non-pixel region from being in contact with a shadow mask, when the shadow mask is shifted to successively form red (R), green (G) and blue (B) EL layers.

According to the prevent invention, the CVD insulating film 128 of low dielectric constant is formed of SiOC film having a dielectric constant below 3.5 in order to suppress (or reduce) the formation of a coupling capacitance between the pixel electrode 126 and the metal electrode 134. The CVD insulating film 128 of low dielectric constant is formed to a thickness of 1 um or more in order, to secure a vertical interval between the pixel electrode 126 and the metal electrode 134. Further, it is preferred that the CVD insulating film 128 of low dielectric constant is overlapped to more than 1 um with the edge portion of the pixel electrode 126 in order to secure alignment margin of the organic EL layer.

In general, the lifting of the metal electrode 134 is not caused above the CVD insulating film 128 of low dielectric constant because a CVD film has good adhesion to the other films and superior step coverage. Further, since the surface of the CVD film is not damaged due to plasma, the wall is formed of the CVD insulating film 128 of low dielectric constant to thereby perform the surface treatment of the pixel electrode 126 using $O_2$ plasma. Accordingly, the luminous efficiency and the luminance properties can be enhanced without damaging the wall.

Further, since a CVD film has lower hydroscopicity and higher thermal resistance than those of an organic film, the deterioration of element is not caused when driving the organic EL element.

In case that an inorganic insulating film of low dielectric constant is deposited by a plasma-enhanced chemical vapor deposition (PECVD) method to form the wall, the dielectric constant can be more decreased by controlling the deposition conditions. Accordingly, the wall can be formed to a thin thickness, thereby reducing the vertical step-difference and increasing a process margin.

FIGS. 2A to 2F are cross-sectional views for illustrating a method of manufacturing the organic EL device shown in FIG. 1.

Figure 2A:
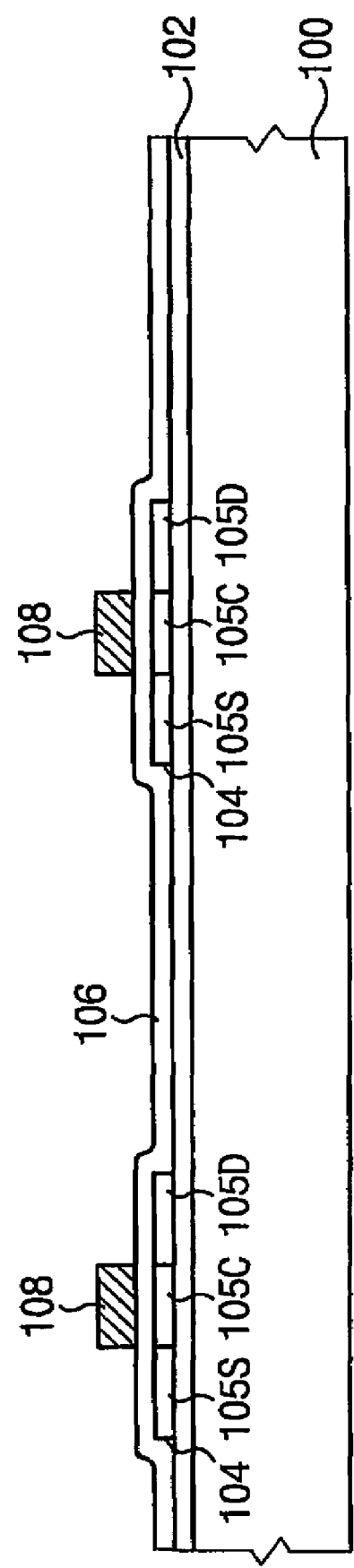

Referring to FIG. 2A, on the entire surface of a transparent insulating substrate 100 such as glass, quartz or sapphire, a silicon oxide is deposited to a thickness of about 1000 A by a PECVD method to form a blocking layer 102. The blocking layer 102 plays a role of preventing impurities in the substrate 100 from being penetrated into a silicon film during a subsequent crystallization process for an amorphous silicon film.

Upon the blocking layer 102, an amorphous silicon film is deposited to a thickness of about 500 A by LPCVD or PECVD method to form an active layer. A laser annealing is carried out to crystallize the active layer into the polycrystalline silicon layer. Then, the polycrystalline silicon layer is patterned through a photolithography process to form an active pattern 104 on a thin film transistor region within a unit pixel.

Thereafter, on the active pattern 104 and the blocking layer 102, a silicon oxide is deposited to a thickness of about 1,000-2,000 Å by the PECVD to form a gate insulating film 106. A gate layer, e.g., a single metal layer containing aluminum (Al) such as Al, AlNd, etc, or a multi-metal layer in which an Al alloy is stacked on chrome (Cr) or molybdenum (Mo) alloy, is deposited and patterned by a photolithography process. As a result, there are formed a gate line (not shown) extending in a first direction and a gate electrode 108 of the thin film transistor branched from the gate line.

Here, impurity ions are implanted using a photo mask used for patterning the gate layer to thereby form source/drain regions 105S and 105D in the surface on both sides of the active pattern 104. During the source/drain implantation, the gate electrode 108 blocks the impurity ions to define a channel region 105C in the active pattern 104 located thereunder.

Referring to FIG. 2B, laser or furnace annealing is performed in order to activate the doped ions of the source/drain regions and to cure the damage of the silicon layer. Then, a silicon nitride is deposited to a thickness of approximately 800 Å on the entire surface of the resultant structure to form an interlayer insulating film 110.

Thereafter, the interlayer insulating film 110 is etched away through a photolithography process to form contact holes 112 and 114 exposing the source/drain regions 105S and 105D. A data layer, e.g., MoW or AlNd, is deposited on the interlayer insulating film 110 and the contact holes 112 and 114 to a thickness of approximately 3,000-6,000 Å, and then, patterned by a photolithography process. By doing so, there are formed a data line (not shown) extending in a second direction perpendicular to the first direction, a direct current signal line (Vdd) and source/drain electrodes 116 and 118 respectively connected to the source/drain regions 105S and 105D through the contact holes 112 and 114.

Through the aforementioned processes, there are formed thin film transistors 120 including the active pattern 104, the gate insulating film 106, the gate electrode 108 and the source/drain electrodes 116 and 118.

Figure 2C:
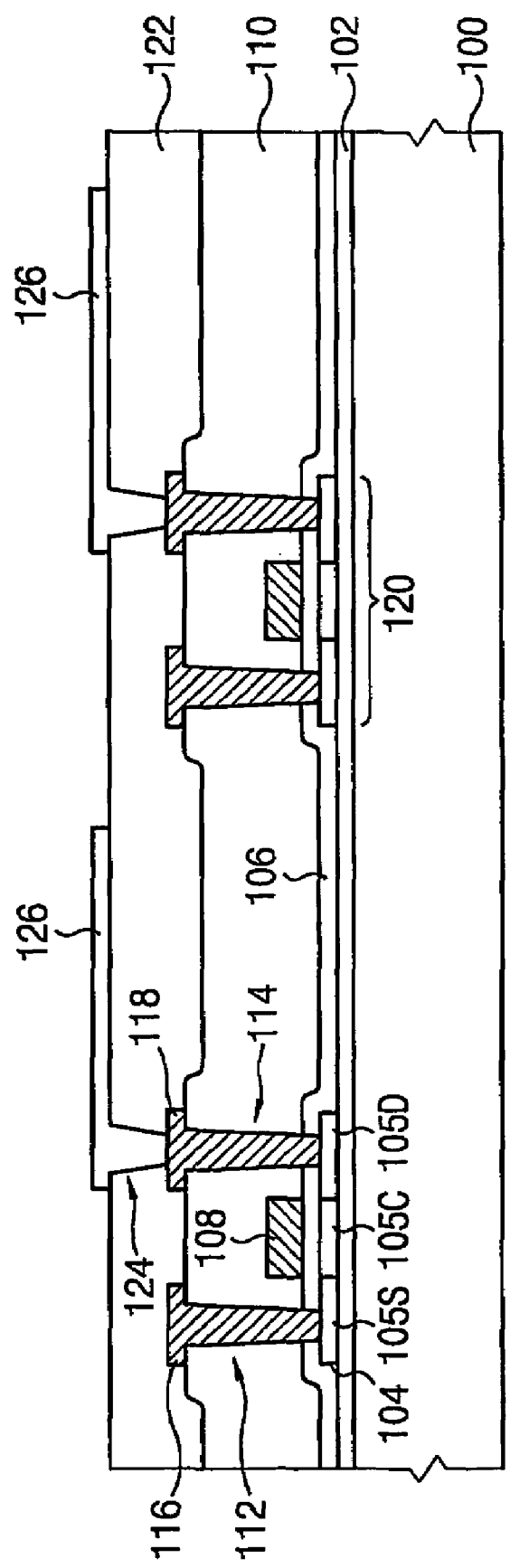

Referring to FIG. 2C, on the interlayer insulating film 110 including the thin film transistors 120, a silicon nitride is deposited to a thickness of approximately 2,000-3,000 Å to form a passivation layer 122. Then, the passivation layer 122 is etched away using a photolithography process to form via holes 124 exposing any one of the source electrode 116 and the drain electrode 118, for example, the drain electrodes 118.

A transparent conductive film such as ITO or IZO is deposited on the passivation layer 122 and the via holes 124, and then, patterned by a photolithography process to form pixel electrodes 126 connected to the drain electrodes 118 of the thin film transistors 120 through the via holes 124. The pixel electrode 126 is provided as an anode of an organic EL element.

Figure 2D:
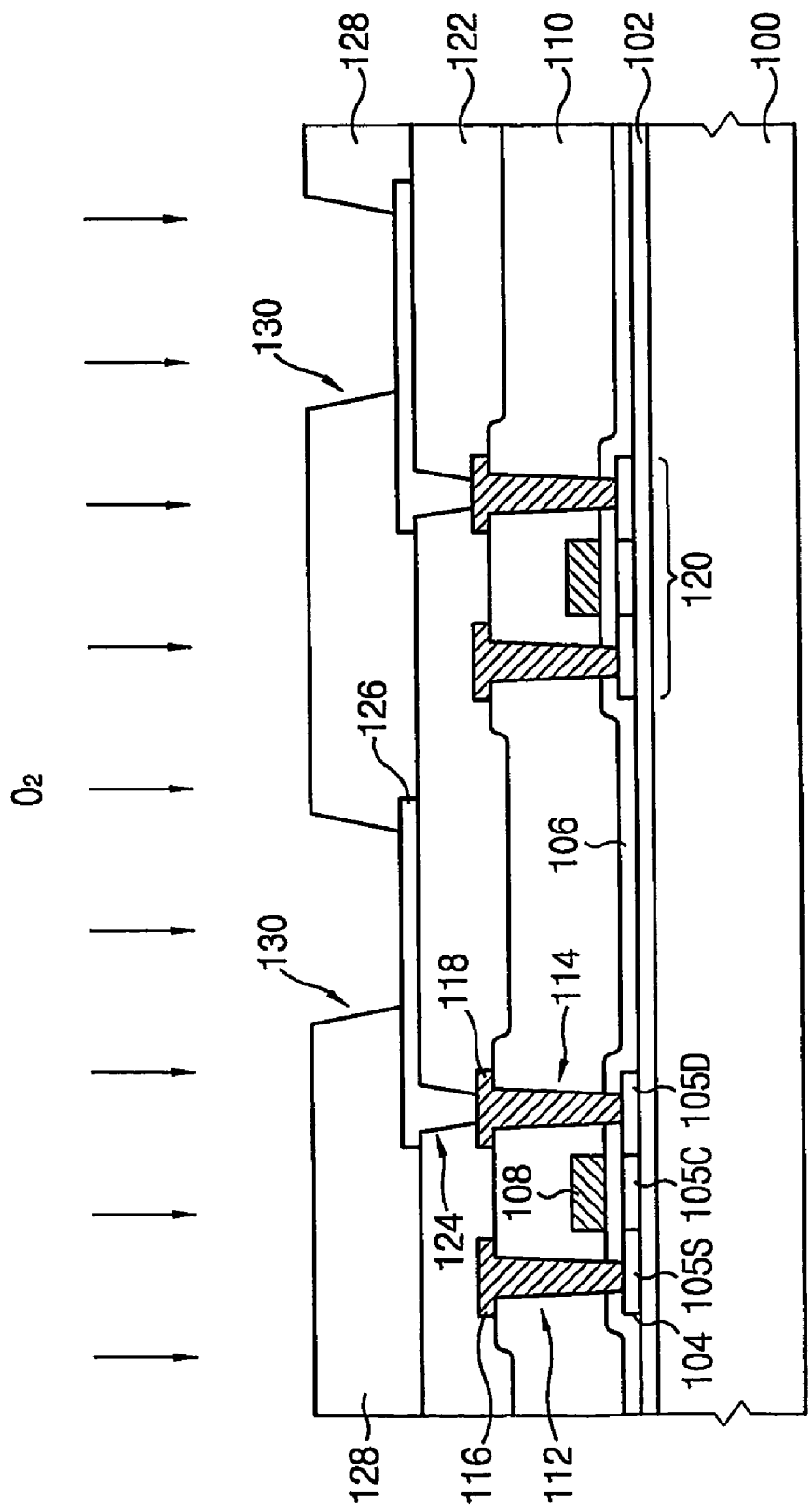

Referring to FIG. 2D, a CVD insulating film 128 of low dielectric constant less than 3.5, e.g., SiOC film, is deposited on the pixel electrodes 126 and the passivation layer 122, and then, patterned by a photolithography process to form openings 130 exposing a portion of the pixel electrodes 126.

Then, in order to enhance luminance properties of the organic EL element, a surface treatment of the pixel electrode 126 is carried out using $O_2$ plasma.

Figure 2E:
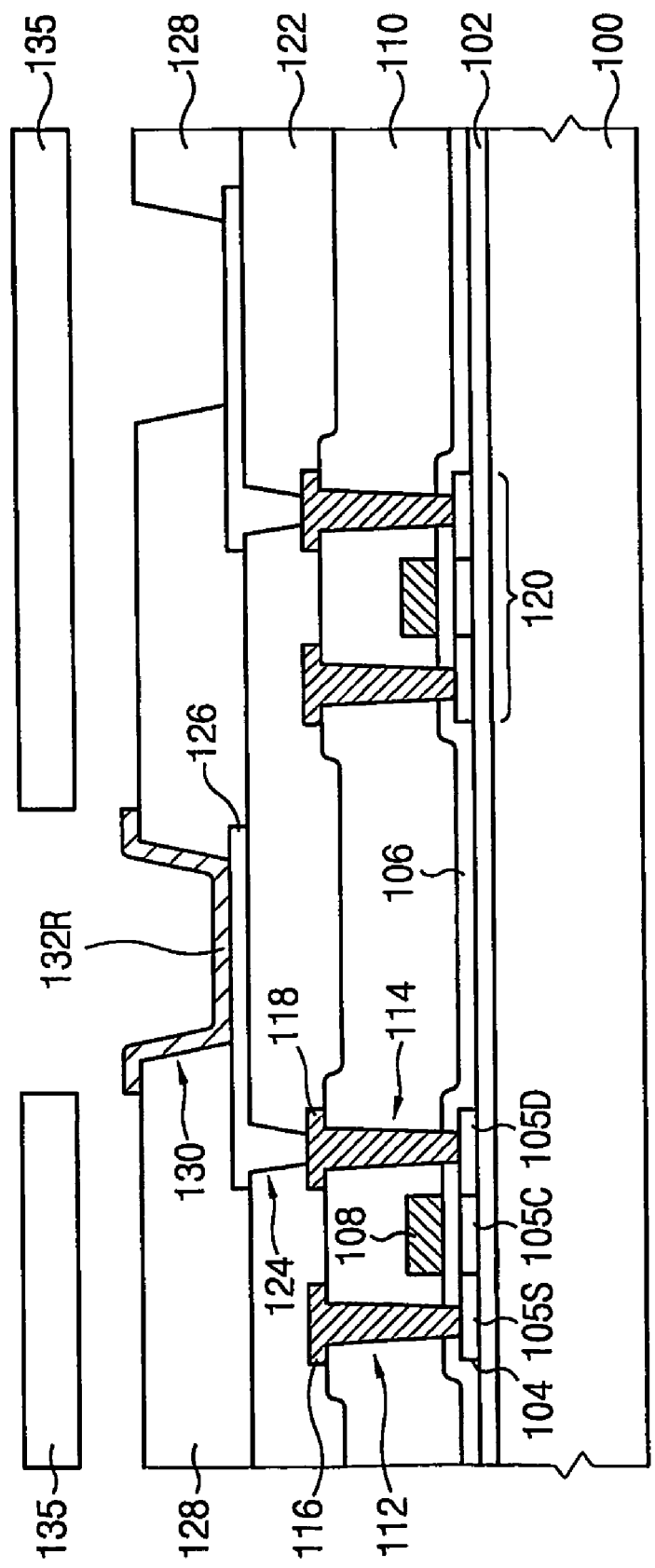

Referring to FIG. 2E, after locating a shadow mask 135 above the CVD insulating film 128 of low dielectric constant having the openings 130, a red organic EL layer 132R is formed.

Figure 2F:
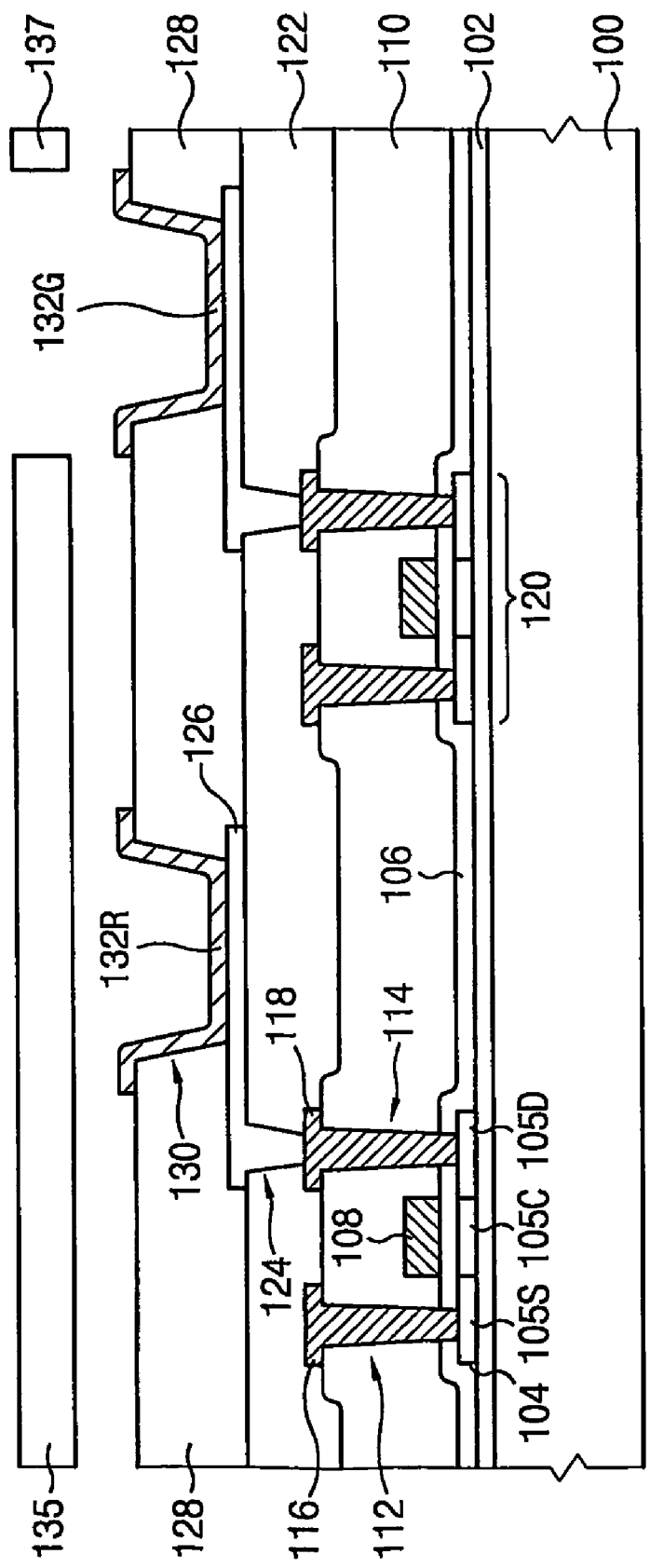

Referring to FIG. 2F, the shadow mask 135 is shifted to form a green organic EL layer 132G. Then, though not shown, the shadow mask 135 is shifted again to thereby form a blue organic EL layer.

After successively forming the red, green and blue organic EL layers as described above, a metal electrode 134 serving as a cathode of the organic EL element is formed on the entire surface of the resultant structure.

FIG. 3 is a cross-sectional view of a passive matrix type organic EL device in accordance with a second embodiment of the present invention.

Referring to FIG. 3, first electrodes (i.e., anode electrodes) 210 comprised of a transparent conductive film such as ITO are formed on a transparent insulating substrate 200 such as glass, quartz or sapphire. The first electrodes 210 are formed in a shape of stripe extending a first direction.

Having openings 240 exposing each of the first electrodes 210, a CVD insulating film 218 of low dielectric constant, e.g., SiOC film is formed on the first electrodes 210 and the substrate 200. Preferably, the CVD insulating film 218 of low dielectric constant has a dielectric constant below 3.5 in order to suppress the formation of a coupling capacitance between the first electrode 210 and a second electrode for a cathode, and is formed to a thickness of 1 um or more.

The CVD insulating film 218 of low dielectric constant serves as a wall surrounding a region where the organic EL layer is formed and separates the second electrode by the unit pixel. Further, the CVD insulating film 218 of low dielectric constant plays a role of preventing the EL layers and the layers of the non-pixel region from being in contact with a shadow mask, when the shadow mask is shifted to successively form red (R), green (G) and blue (B) EL layers.

Preferably, the CVD insulating film 218 of low dielectric constant is patterned so as to have an inverse tapered slope. Accordingly, the opening 240 exposing the first electrode 210 is formed with a tapered slope.

Between the first electrode 210 and the CVD insulating film 218 of low dielectric constant, an insulating layer 215 is formed in order to cover the edge portion of the first electrode 210. That is, the insulating layer 215 plays a role of preventing organic EL layers from being deposited on the stepped portion of the first electrode 210.

Red, green and blue organic EL layers 220 R, 220G and 220B are formed on each of the openings 240. On the organic EL layers 220R, 220G and 220B, there is formed the second electrode 225 in a form of stripe extending a second direction perpendicular to the first direction. Accordingly, the cross part of the first and second electrodes 210 and 225 becomes a unit pixel region.

The organic EL layers 220R, 220G and 220B includes more than one layer; a hole injection layer (HIL), a hole transfer layer (HTL), an emission layer (EML), an electron transfer layer (ETL) and an electron injection layer (EIL).

The second electrode 225 should be separated by the unit pixel in order to apply an individual signal to each of the pixels because no switching element for driving each of the pixels is formed in the passive matrix type organic EL device. Therefore, if the CVD insulating film 218 of low dielectric constant is formed to have an inverse tapered slope, the second electrode 225 is deposited only on the top of the CVD insulating film 218 of low dielectric constant and the bottom of the opening 240, excluding the sidewalls of the opening 240 having a tapered slope. As a result, the second electrode 225 is simultaneously separated by the unit pixel during the deposition of the second electrode 225.

In a conventional passive matrix type organic EL device, a high polymeric organic insulating film of low dielectric constant is used as the separator of the second electrode and the wall. Accordingly, $O_2$ plasma treatment of the first electrode 210 for increasing the luminous efficiency cannot be performed because the high polymers of the organic insulating film are easily damaged due to the plasma.

On the contrary, in the passive matrix type organic EL device of the present invention, the CVD insulating film of low dielectric constant is used as the separator of the second electrode and the wall, so that the surface treatment of the first electrode 210 is performed using $O_2$ plasma to thereby enhance the luminous efficiency of the organic EL element.

Further, the lifting of the second electrode 225 is not generated because the CVD insulating film 218 of low dielectric constant has good adhesion to the other films. In addition, when driving the organic EL element, the element is not deteriorated because the CVD insulating film 218 of low dielectric constant has lower hydroscopicity and higher thermal resistance than those of an organic film.

Figure 4:
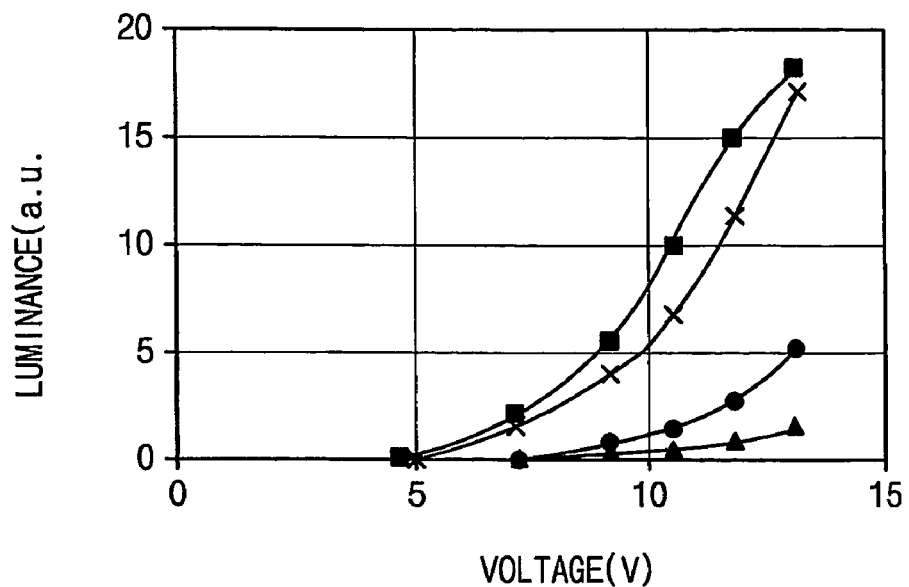
FIG. 4 is a graph showing voltage-current characteristic of the organic EL device in accordance with the present invention.

FIG. 4 is a graph showing voltage-current characteristic of the organic EL device in accordance with the present invention. In graph, a symbol ◇ indicates a case where only the first electrode comprised of ITO is formed on the entire surface of the transparent insulating substrate. A symbol ■ indicates a case where the surface of the first electrode is $O_2$ plasma-treated. A symbol ▲ indicates a case where the CVD insulating film of low dielectric constant, e.g., SiOC film is deposited on the first electrode. A symbol x indicates a case where the surface of the first electrode is $O_2$ plasma-treated after the SiOC film is deposited.

Referring to FIG. 4, in the case (▲) where the CVD insulating film of low dielectric constant, e.g., SiOC film was deposited on the first electrode comprised of ITO, the voltage-current characteristic was more deteriorated than the case (◇) of forming only first electrode. However, in the case (x) where the $O_2$ plasma treatment was performed after depositing the SiOC film, the voltage-current characteristic was enhanced to the same level as that of the case (■) where the $O_2$ plasma treatment was performed to the substrate on which only first electrode is formed.

Figure 5:
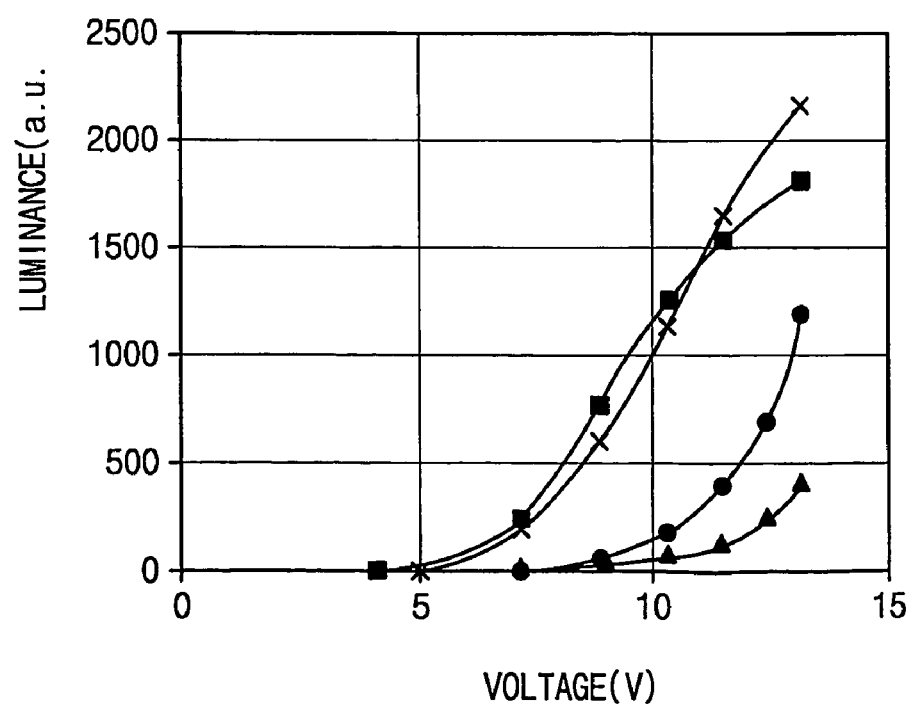
FIG. 5 is a graph showing luminance-voltage characteristic of the organic EL device in accordance with present invention.

FIG. 5 is a graph showing luminance-voltage characteristic of the organic EL device in accordance with the present invention. In graph, a symbol ◇ indicates a case where only the first electrode comprised of ITO was formed on the entire surface of the transparent insulating substrate. A symbol ■ indicates a case where the surface of the first electrode is $O_2$ plasma-treated. A symbol ▲ indicates a case where the CVD insulating film of low dielectric constant, e.g., SiOC film is deposited on the first electrode. A symbol x indicates a case where the surface of the first electrode is $O_2$ plasma-treated after the SiOC film is deposited.

Referring to FIG. 5, in the case (▲) where the CVD insulating film of low dielectric constant, e.g., SiOC film was deposited on the first electrode comprised of ITO (case ▲), the luminance-voltage characteristic was more deteriorated than the case (◇) of forming only first electrode. However, in the case (x) where the $O_2$ plasma treatment was performed after depositing the SiOC film (case x), the luminance-voltage characteristic was enhanced to the same level as that of the case (■) where the $O_2$ plasma treatment was performed to the substrate on which only first electrode is formed.

Figure 6:
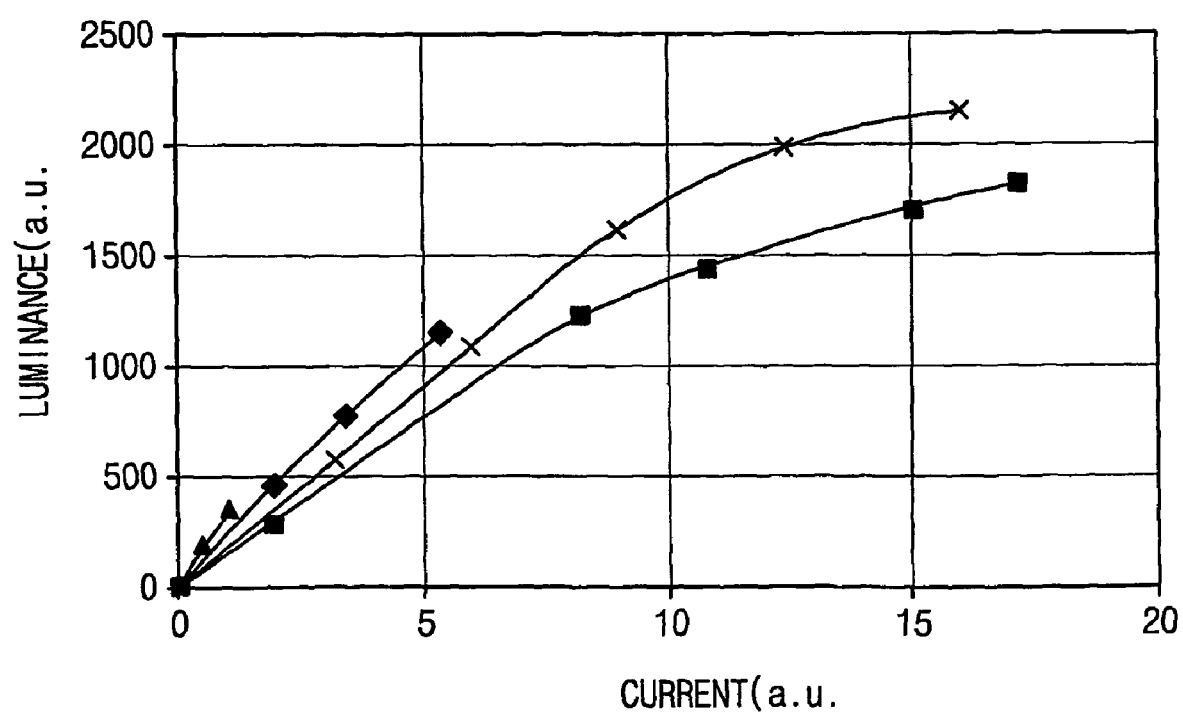
FIG. 6 is a graph showing luminance-current characteristic of the organic EL device in accordance with the present invention.

FIG. 6 is a graph showing luminance-current characteristic of the organic EL device in accordance with the present invention. In graph, a symbol ◊ indicates a case where only the first electrode comprised of ITO is formed on the entire surface of the transparent insulating substrate. A symbol ■ indicates a case where the surface of the first electrode is $O_2$ plasma-treated. A symbol ▲ indicates a case where the CVD insulating film of low dielectric constant, e.g., SiOC film is deposited on the first electrode. A symbol x indicates a case where the surface of the first electrode is $O_2$ plasma-treated after the SiOC film is deposited.

Referring to FIG. 6, in the case (x) where the SiOC film was deposited on the first electrode and the $O_2$ plasma treatment was carried out, it was obtained the superior luminance-current characteristic as compared to the case (■) where the $O_2$ plasma treatment was performed to the substrate on which only first electrode is formed.

According to the present invention as described above, a wall surrounding a region of an organic EL layer is comprised of a CVD insulating film of low dielectric constant. Since the surface of the CVD insulating film of low dielectric constant is not damaged due to plasma, the surface treatment of the pixel electrode is performed using $O_2$ plasma to thereby enhance the luminous efficiency and the luminance properties.

Further, the CVD insulating film of low dielectric constant having good adhesion and step coverage is utilized to cause no lifting of a metal electrode (i.e., second electrode). In addition, when driving the organic EL element, the element is not deteriorated because the CVD insulating film 218 of low dielectric constant has lower hydroscopicity and higher thermal resistance than those of an organic film.

While the present invention has been described in detail, it should be understood that various changes, substitutions and alterations can be made hereto without departing from the spirit and scope of the invention as defined by the appended claims.

The invention claimed is:

1. An organic electroluminescent device comprising:
a substrate;
a thin film transistor formed on the substrate;
a first electrode electrically coupled to the thin film transistor and having a surface treated by oxygen plasma;
a chemical vapor deposition insulating film formed on the first electrode and the substrate, the chemical vapor deposition film having an opening portion extending to the first electrode;
an organic electroluminescent layer formed in the opening portion; and
a second electrode formed on the organic electroluminescent layer.

2. The device as claimed in claim 1, wherein the chemical vapor deposition insulating film comprises SiOC.

3. The device as claimed in claim 1, wherein the chemical vapor deposition insulating film has a dielectric constant less than about 3.5.

4. The device as claimed in claim 1, wherein the chemical vapor deposition insulating film is formed to have a thickness more than about 1 μm between the first electrode and the organic electroluminescent layer.

5. The device as claimed in claim 1, wherein the opening portion of the chemical vapor deposition insulating film has a tapered shape, and the second electrode has a stripe shape and crosses the first electrode.

6. The device as claimed in claim 5, wherein the chemical vapor deposition insulating film is comprised of SiOC.

7. The device as claimed in claim 5, wherein the chemical vapor deposition insulating film has a dielectric constant less than about 3.5.

8. The device as claimed in claim 5, wherein the chemical vapor deposition insulating film has a thickness more than about 1 μm between the first electrode and the organic electroluminescent layer.

* * * * *